(12) United States Patent
Ge et al.

(10) Patent No.: US 10,954,480 B2
(45) Date of Patent: Mar. 23, 2021

(54) COMPOSITIONS AND METHODS FOR PREVENTING COLLAPSE OF HIGH ASPECT RATIO STRUCTURES DURING DRYING

(71) Applicant: Versum Materials US, LLC, Tempe, AZ (US)

(72) Inventors: Jhih Kuei Ge, Chupei (TW); Yi-Chia Lee, Danshu (TW); Wen Dar Liu, Chupei (TW); Tianniu Rick Chen, Chupei (TW)

(73) Assignee: Versum Materials US, LLC, Tempe, AZ (US)

(*) Notice: Subject to any disclaimer, the term of this patent is extended or adjusted under 35 U.S.C. 154(b) by 45 days.

(21) Appl. No.: 16/141,735

(22) Filed: Sep. 25, 2018

(65) Prior Publication Data

US 2019/0119610 A1    Apr. 25, 2019

Related U.S. Application Data

(60) Provisional application No. 62/565,266, filed on Sep. 29, 2017.

(51) Int. Cl.
| | | |
|---|---|---|
| *C11D 7/32* | (2006.01) | |
| *C11D 11/00* | (2006.01) | |
| *C11D 7/50* | (2006.01) | |
| *C11D 7/26* | (2006.01) | |
| *C11D 7/34* | (2006.01) | |
| *C11D 3/43* | (2006.01) | |
| *C11D 1/40* | (2006.01) | |
| *H01L 21/02* | (2006.01) | |
| *C11D 3/20* | (2006.01) | |

(52) U.S. Cl.
CPC ............ *C11D 11/0047* (2013.01); *C11D 1/40* (2013.01); *C11D 3/43* (2013.01); *C11D 7/265* (2013.01); *C11D 7/3209* (2013.01); *C11D 7/34* (2013.01); *C11D 7/5022* (2013.01); *C11D 3/2068* (2013.01); *H01L 21/02057* (2013.01)

(58) Field of Classification Search
CPC .................................................. C11D 11/0047
USPC ......................................................... 510/175
See application file for complete search history.

(56) References Cited

U.S. PATENT DOCUMENTS

| | | |
|---|---|---|
| 8,617,993 B2 | 12/2013 | Yasseri et al. |
| 8,957,006 B2 | 2/2015 | Ting et al. |
| 9,570,343 B2 | 2/2017 | Westwood |
| 2010/0152086 A1* | 6/2010 | Wu .................. C11D 7/265 510/175 |
| 2013/0280123 A1 | 10/2013 | Chen et al. |
| 2014/0256155 A1 | 9/2014 | Ting et al. |

FOREIGN PATENT DOCUMENTS

JP          11295902 A2      10/1999

* cited by examiner

*Primary Examiner* — Gregory E Webb
(74) *Attorney, Agent, or Firm* — William T. Slaven, IV

(57) ABSTRACT

Described herein is an aqueous composition for treating a substrate including patterns having line-space dimensions of 50 nm or below to prevent collapse of the patters, the composition comprising: a solvent system comprising water and a water-miscible organic solvent; a surface modifier that is a reaction product between an alkylamine and an organic acid; and an optional pH adjusting agent.

24 Claims, No Drawings

COMPOSITIONS AND METHODS FOR PREVENTING COLLAPSE OF HIGH ASPECT RATIO STRUCTURES DURING DRYING

CROSS-REFERENCE TO RELATED APPLICATIONS

This application claims priority under 35 U.S.C. § 119(e) to U.S. provisional patent application No. 62/565,266, filed on Sep. 29, 2017, the entirety of which is incorporated herein by reference.

BACKGROUND OF THE INVENTION

The present invention relates to methods for cleaning/drying high aspect ratio structures, wherein the collapse of said structures during drying is substantially prevented.

Semiconductor device manufacturing generally includes various steps of device patterning process. With continuous scale-down and shrinkage of real estate available for a single semiconductor device, engineers are daily facing the challenge of how to meet the market demand for ever increasing device density. One technique was the creation of finFETs, which are formed through a technique called sidewall image transfer (SIT), also known as sidewall spacer image transfer. However, due to the scaling of these devices, there remains a risk of pattern collapse for tight pitch and high aspect ratio configurations, such as the fin or gate modules.

For example, pattern collapse can occur during the drying step following a wet etch process due to the high capillary forces experienced between the "fin" structures. Current attempts to mitigate this collapse include the use of organic molecules to chemically bond on surface to increase contact angle of the rinse solutions but such surface modifiers can bond to the substrate surface to leave a residue that, in turn, is difficult to remove. In this regard, an ashing step can be added to remove the surface modifier residue but the ashing conditions can also lead to fin damage. The stack of materials for semiconductor devices may comprise different materials such as silicon, silicon oxide, and silicon nitride. These materials maybe a single layer or multi layers in different orders. The stack may be formed by a number of methods, including physical vapor deposition, chemical vapor deposition, electrochemical deposition and molecular beam epitaxy. One stack order may be silicon oxide layer on the silicon substrates to form silicon oxide trench. With technical node shrink, more stack orders are used, for example, a stack order may include the middle silicon oxide layer on the bottom silicon layer and silicon nitride layer on the top. In order to prevent the pattern collapse of this new stack structures, the surface modification chemistry not only has to effect the silicon oxide surface, and the silicon nitride and silicon surfaces too.

Accordingly, there is a need in the art for a fin surface modification chemistry that does not suffer from the above drawbacks.

BRIEF SUMMARY OF THE INVENTION

In one aspect, the present invention provides an aqueous composition for treating a substrate including patterns having line-space dimensions of 50 nm or below to prevent collapse of the patterns, the composition comprising: a solvent system comprising water and a water-miscible organic solvent; a surface modifier that is a reaction product between an alkylamine and an organic acid; and a pH adjusting agent.

In another aspect, the present invention provides a method for treating a substrate including patterns having line-space dimensions of 50 nm or below, the method comprising rinsing the substrate with an aqueous composition comprising: a solvent system comprising water and a water-miscible organic solvent; a surface modifier that is a reaction product between an alkylamine and an organic acid; and a pH adjusting agent.

The embodiments of the invention can be used alone or in combinations with each other.

DETAILED DESCRIPTION OF THE INVENTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. The use of the term "comprising" in the specification and the claims includes the more narrow language of "consisting essentially of" and "consisting of".

Embodiments of this invention are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The present invention relates generally to aqueous compositions for treating a substrate including patterns having line-space dimensions of 50 nm or below to prevent collapse of the patters, the composition comprising: a solvent system comprising water and a water-miscible organic solvent; a surface modifier that is a reaction product between an alkylamine and an organic acid; and a pH adjusting agent. Additionally the compositions are particularly effective when the patterns comprise stacks comprising one or more layers, that may be alternating, of silicon, silicon oxide and/or silicon nitride.

It will be understood that the term "silicon" as deposited as a material on a microelectronic device will include polysilicon.

For ease of reference, "microelectronic device" corresponds to semiconductor substrates, such as, wafers, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As used herein, the term "alkyl" means a saturated hydrocarbon group which is straight-chained or branched. In some embodiments, the alkyl group has from 1 to 20 carbon atoms, from 2 to 20 carbon atoms, from 1 to 10 carbon atoms, from 2 to 10 carbon atoms, from 1 to 8 carbon atoms, from 2 to 8 carbon atoms, from 1 to 6 carbon atoms, from 2 to 6 carbon atoms, from 1 to 4 carbon atoms, from 2 to 4 carbon atoms, from 1 to 3 carbon atoms, or 2 or 3 carbon atoms. In alternative embodiments, the alkyl group may have from 6 to 20 carbon atoms, from 6 to 18 carbon atoms, from 8 to 18 carbon atoms, from 9 to 16 carbon atoms, from 9 to 14 carbon atoms, from 8 to 15 carbon atoms, or from 10 to 14 carbon atoms. In alternative embodiments the alkyl group may have the number of carbon atoms in any range having endpoints from the following list: 1, 2, 3, 4, 5, 6, 7, 8, 9, 10, 11, 12, 13, 14, 15, 16, 17, 18, 19, 20, 21, 22, 23 and 24. Examples of alkyl groups include, but are not limited to, methyl (Me), ethyl (Et), propyl (e.g., n-propyl and isopropyl), butyl (e.g., n-butyl, t-butyl, isobutyl), pentyl (e.g., n-pentyl, isopentyl, neopentyl), hexyl, isohexyl, heptyl, octyl, nonyl, 4,4-dimethylpentyl, 2,2,4-trimethylpentyl, decyl, undecyl, dodecyl, 2-methyl-1-propyl, 2-methyl-2-propyl, 2-methyl-1-butyl, 3-methyl-1-butyl, 2-methyl-3-butyl, 2-methyl-1-pentyl, 2,2-dimethyl-1-propyl, 3-methyl-1-pentyl, 4-methyl-1-pentyl, 2-methyl-2-pentyl, 3-methyl-2-pentyl, 4-methyl-2-pentyl, 2,2-dimethyl-1-butyl, 3,3-dimethyl-1-butyl, 2-ethyl-1-butyl, and the like.

As used herein, the term "amino" means —$NH_2$.

As used herein, the term "alkylamino" means an amino group substituted with an alkyl group. In some embodiments, the alkyl group is a lower alkyl group having from 1 to 6 carbon atoms. Alkylamino groups include, but are not limited to, —$NHCH_2CH_3$, —$NH(CH_2)_2CH_3$, —$NH(CH_2)_3CH_3$, —$NH(CH_2)_4CH_3$, and —$NH(CH_2)_5CH_3$, and the like. In alternative embodiments, the alkyl group may have any of the numbers of carbons in the ranges described above, such as from 8 to 14 carbons or from 9 to 14 carbons.

"Substantially free" is defined herein as less than 0.001 wt. %. "Substantially free" also includes 0.000 wt. %. The term "free of" means 0.000 wt. %.

As used herein, "about" is intended to correspond to ±5% of the stated value.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed. All amounts are weight percents, unless otherwise specified. All weight percents are based on the total composition, that is a total of 100%.

In one aspect of this invention, the aqueous composition comprises, consists essentially of, or consists of a solvent system comprising water and a water-miscible organic solvent; a surface modifier that is a reaction product between a ($C_2$-$C_{20}$) alkylamine and para-toluenesulfonic acid; and a pH adjusting compound.

In some embodiments, the compositions disclosed herein are formulated to be substantially free or free of of at least one of the following chemical compounds: fluorides, inorganic acids, alkyl thiols, and organic silanes. In some embodiments, the compositions disclosed herein are formulated to be substantially free or free of inorganic bases and/or quaternary ammonium compounds, that may include quaternary ammonium fluorides and/or quaternary ammonium hydroxides, for examples, the composition may be free of one or more of the following: tetramethylammonium fluoride, tetraethylammonium fluoride, methyltriethylammonium fluoride, tetrabutylammonium fluoride, tetramethylammonium hydroxide, tetraethylammonium hydroxide, methyltriethylammonium hydroxide, and/or tetrabutylammonium hydroxide. In some embodiments, the composition is free of chelating agents, such as EDTA and/or corrosion inhibitors, such as triazoles. In some embodiments, the composition may be substantially free of or free of one or more of the following: hydroxides and/or metal hydroxides, such as KOH or LiOH or NaOH. In other embodiments, the composition may be substantially free of or free of one or more halide-containing compounds, for example, it may be substantially free or free of one or more of the following: fluorine-, bromine-, chlorine- or iodine-containing compounds. In other embodiments, the composition may be substantially free or free of phosphoric acid and/or nitric acid and/or hydrochloric acid. In other embodiments, the composition may be substantially free or free of sulfates and/or nitrates and/or sulfites and/or nitrites. In other embodiments, the composition may be substantially free or free of: ammonium hydroxide and/or ethyl diamine. In other embodiments, the composition may be substantially free or free of: sodium-containing compounds and/or calcium-containing compounds and/or manganese-containing compounds or magnesium-containing compounds and/or chromium-containing compounds and/or silane-containing compounds and/or phosphorus-containing compounds. Some embodiments may be substantially free of or free of alkanolamines and/or hydroxylamines. In other embodiments, the compositions of the present invention may be substantially free or free of oxidizing agents such as, for example, peroxide compounds such as, for example, hydrogen peroxide, persulfates (e.g., monopersulfates and/or dipersulfates), percarbonates and/or acids thereof and/or salts thereof and/or mixtures thereof. In other embodiments, compositions of the present invention may be substantially free or free of one or more oxidizing agents, such as, for example, oxidized halides (e.g., iodates, periodates, and/or acids thereof, and/or mixtures thereof), perboric acid, perborates, percarbonates, peroxyacids (e.g., peracetic acid, perbenzoic acid, salts thereof, permanganates, cerium compounds and/or ferricyanides (e.g., potassium ferricyanide).

The headings employed herein are not intended to be limiting; rather, they are included for organizational purposes only.

The compositions disclosed herein exhibit excellent ability to lower the capillary force between stacked surface patterns during the manufacture of a microelectronic device wherein the stacked surface patterns have line-space dimensions between the stacks of 50 nm or below to prevent collapse of the patterns.

Solvent System

The compositions disclosed herein comprise a solvent system comprising water and a water-miscible organic solvent. The solvent system functions in part to vary the viscosity and the surface tension of the composition as well as to solubilize the surface modifier.

Some non-limiting examples of water include deionized water, ultra-pure water, distilled water, doubly distilled water, or deionized water having a low metal content. The water component of the solvent system is preferably de-ionized (DI) water.

It is believed that, for most applications, the weight percent of water (from all sources, including water added with other components such as in aqueous solutions) in the composition will be present in a range with start and end points selected from the following group of numbers: 0.5, 1, 5, 10, 15, 20, 25, 30, 40, 50, 55, 60, 65, 70, 75, 80, 85, 90, and 95. Examples of the ranges of water that may be used in the composition include, for examples, from about 50% to about 90% by wt., or 60% to about 90% by wt. of water; or from about 70% to about 90% by wt., or from about 50% to about 80% by wt., or from about 60% to about 85% by wt., or from about 75% to about 90% by wt.; or from about 20% to about 90% by wt.; or from about 30 to about 90% by wt. or from about 60% to about 80% by wt.; or from about 55% to about 80% by wt.; or from about 55 to about 85% by wt. of water. Still other preferred embodiments of the present invention may include water in an amount to achieve the desired weight percent of the other ingredients.

The second component of the solvent system is a water-miscible organic solvent. The water-miscible organic solvent includes organic amines, amides, sulfoxides, sulfones, lactams, imidazolidinones, lactones, polyhydric alcohols, glycol ethers, glycols, and the like. Examples of organic amines include monoethanolamine (MEA), N-methylethanolamine (NMEA), ethylenediamine, 2-(2-aminoethylamino)ethanol, diethanolamine, dipropanolamine, 2-ethylaminoethanol, dimethylaminoethanol, cyclohexyanolamine, benzylamine, pyrrole, pyrrolidine, pyridine, morpholine, piperidine, oxazole and the like. Examples of amides includes N,N-dimethylformamide, dimethylacetamide (DMAC), diethylacetamide and the like. Examples of sulfoxides include dimethyl sulfoxide. Examples of sulfones include dimethyl sulfone and diethyl sulfone. Examples of lactams include N-methyl-2-pyrrolidone and imidazolidinone. Examples of lactones include butyrolactone and valerolactone. Examples of polyhydric alcohols include ethylene glycol, propylene glycol, and glycerol. Still further examples of organic solvents include, but are not limited to, N-methylpyrrolidinone (NMP), dimethylformamide, N-methylformamide, formamide, dimethyl-2-piperidone (DMPD), tetrahydrofurfuryl alcohol, or multifunctional compounds, such as hydroxyamides or amino alcohols. The water-miscible organic solvents enumerated above may be used alone or in combination with two or more solvents.

In certain embodiments, the water soluble organic solvent may be a glycol ether. The glycol ethers may include glycol mono($C_1$-$C_6$)alkyl ethers and glycol di($C_1$-$C_6$)alkyl ethers, such as but not limited to, ($C_1$-$C_{20}$)alkane diols, ($C_1$-$C_6$) alkyl ethers, and ($C_1$-$C_{20}$)alkane diol di($C_1$-$C_6$)alkyl ethers. Examples of glycol ethers are ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol methyl ethyl ether, ethylene glycol monomethyl ether acetate, ethylene glycol monethyl ether acetate, ethylene glycol monomethyl ether acetate, dipropylene glycol methyl ether (DPM), tripropylene glycol methyl ether, propylene glycol monomethyl ether, propylene glycol dimethyl ether, propylene glycol monobutyl ether, propylene glycol, monoproply ether, dipropylene glycol monomethyl ether, dipropylene glycol monopropyl ether, dipropylene glycol monoisopropyl ether, dipropylene monobutyl ether, diproplylene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy)ethanol. More typical examples of glycol ethers are propylene glycol monomethyl ether, propylene glycol monopropyl ether, tri(propylene glycol) monomethyl ether, 2-(2-butoxyethoxy)ethanol and DPM.

It is believed that, for most applications, the amount of water-miscible organic solvent in the composition may be in a range having start and end points selected from the following list of weight percents: 0.5, 1, 5, 7, 12, 15, 17, 20, 25, 28, 30, 32, 35, 40, 50, 59.5, 60, 65, 70, 75 and 80. Examples of such ranges of solvent include from about 0.5% to about 75% by weight; or from about 1% to about 60% by weight; or from about 5% to about 50% by weight; or from about 5% to about 60% by weight; or from about 15% to about 30% by weight; or from about 5% to about 30% by weight; or from about 15% to about 35% by weight; or from about 17% to about 32% by weight; or from about 25% to about 35% by weight; or from about 20% to about 40% by weight; or from about 28% to about 32% by weight of the composition.

In the compositions disclosed herein the solvent system (i.e., water plus water-miscible organic solvent) may comprise from 5 to 99.9% by weight or from 10 to 99.6% by weight or from 50 to 99.9% by weight or from 60 to 99.6% by weight or from 90 to 99.9% by weight of the composition. Alternatively, the amount of the solvent system may be any range defined by any of the following weight percents: 5, 10, 50, 60, 70, 75, 80, 85, 90, 91, 92, 93, 95, 97, 98, 99, 99.3, 99.6, 99.7 and 99.9. In one embodiment, the solvent system may contain a major amount of one or more water-miscible organic solvents (i.e., 50% by weight or greater) and a minor amount of water (i.e., less than 50% by weight). In an alternative embodiment, the solvent system may contain a major amount of water (i.e., 50% by weight or greater) and a minor amount of one or more water-miscible organic solvents (i.e., less than 50% by weight) based on the total weight of the solvent system (water plus water miscible organic solvent). In one embodiment, the solvent system comprises about 70% water and about 30% water-miscible organic solvent based on the total weight of the solvent system (water plus water miscible organic solvent). In another embodiment, the solvent system comprises about 80% water and about 20% water-miscible organic solvent based on the total weight of the solvent system (water plus water miscible organic solvent). In yet embodiment, the solvent system comprises about 60% water and about 40% water-miscible organic solvent based on the total weight of the solvent system (water plus water miscible organic solvent). In yet another embodiment, the solvent system comprises about 75% water and about 25% water-miscible organic solvent based on the total weight of the solvent system (water plus water miscible organic solvent.

Surface Modifier

The compositions disclosed herein comprise a surface modifier that is a reaction product between an alkylamine and an organic acid. The alkylamine and the organic acid may react in situ upon addition of the components or be reacted prior to addition to the composition.

The alkyl amine may be primary, secondary, or tertiary. Examples of suitable alkylamines include methylamine, ethylamine, n-propylamine, isopropylamine, n-butylamine, isobutylamine, s-butylamine, t-butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, nonadecylamine, icosylamine, eicosylamine, henicosylamine, heneicosylamine, docosylamine, tricosylamine, tetracosylamine, 1-methylbutylamine, 2-methylbutylamine, cyclopropylmethylamine, cyclohexylmethylamine, benzylamine, 2-methylbenzylamine, 4-methylbenzylamine, 1-phenylethylamine, 2-phenylethylamine, 3-aminomethylpyridine, 1-(4-chlorophenyl)ethylamine, 2-(2-chlorophenyl)ethylamine, 1-(3-methoxyphenyl)ethylamine, 1-(4-methoxyphenyl)ethylamine, 2-(2-methoxyphenyl)ethylamine, 2-(3-methoxyphenyl)ethylamine, 2-(4-methoxyphenyl)ethylamine, 1-[3-(trifluoromethyl)phenyl]ethylamine, 1-(1-naphthyl)ethylamine, 1-(2-naphthyl)ethylamine, I-phenylpropylamine, and 3-phenylpropylamine, and mixtures thereof.

In preferred embodiments, the alkylamine component is a primary amine. Generally speaking, it has been found that as the number of carbons increases in the alkyl group, the DIW contact angle on a silicon substrate becomes higher and the surface tension becomes lower. 1-dodecylamine is a preferred alkylamine.

It is believed that the amount of the alkylamine component in the composition (the total present in the solution and as part of the reaction product forming the surface modifier, that is, the total amount added to the solution) will, for the most applications, comprise from about 0.01% to about 5% by weight of the composition, specifically, about 0.05% to about 5.0% by weight of the composition, or more specifically, about 0.1% to about 4.5% by weight of the composition. Alternatively the weight percent of the alkylamine component in the composition may be in any range having endpoints selected from the following weight percents: 0.01, 0.05, 0.1, 0.15, 0.2, 0.25, 0.3, 0.35, 0.4, 0.45, 0.5, 1, 2, 2.5, 3, 3.5, 4, 4.5 and 5. In some embodiments, the alkylamine component comprises from about 0.1% to about 4.0% by weight or from about 0.3 to about 3.5% or from about 0.1 to 0.5% by weight or about from about 0.3 to about 1.0% or from about 0.05 to 2% by weight, or about from about 0.05 to about 3.5% or from about 0.05 to 1% by weight or about from about 0.1 to about 3.5% or from about 0.1 to 1% by weight or about from about 0.2 to about 1.0% or from about 0.2 to about 1% by weight of the composition.

Examples of organic acids for reaction with the alkylamine include aliphatic/aromatic carboxylic acids, amino carboxylic acid, sulfonic acids and aminosulfonic acid. Exemplary carboxylic acids include, but are not limited to, acetic acid, propionic acid, butyric acid, pentanoic acid, 3-methylbutanoic acid, hexanoic acid, heptanoic acid, octanoic acid, nonanoic acid, decanoic acid, dodecanoic acid, tridecanoic acid, tetradecanoic acid, pentadecanoic acid, hexadecanoic acid, heptadecanoic acid, octadecanoic acid, dodecanedioic acid, 2-methylheptanoic acid, 2-hexyldecanoic acid, oxalic acid, malonic acid, maleic acid, fumaric acid, succinic acid, itaconic acid, glutaric acid, adipic acid, malic acid, tartaric acid, acrylic acid, methacrylic acid, citric acid, lactic acid, glycolic acid, ascorbic acid, anthranilic acid, gallic acid, benzoic acid, isophthalic acid, phthalic acid, trimellitic acid, pyromellitic acid, salicylic acid, 2,4-dihydroxy benzoic acid and others. Exemplary amino carboxylic acids include, but are not limited to, glycine, dihydroxy ethyl glycine, alanine, valine, leucine, asparagine, glutamine, aspartic acid, glutaric acid, lysine, arginine, imino diacetic acid, nitrilo triacetic acid, ethylenediamine tetraacetic acid, 1,2-cyclohexadiamine tetraacetic acid, diethylene triamine pentaacetic acid, and others. Exemplary sulfonic/aminosulfonic acids include, but are not limited to, benzyl sulfonic acid, p-toluene sulfonic acid, 2-(N-morpholino)ethanesulfonic acid, N-(2-hydroxyethyl)piperazine-N'-(ethanesulfonic acid), 3-[N,N-bis(2-hydroxyethyl)amino]-2-hydroxypropanesulfonic acid, 4-(N-morpholino)butanesulfonic acid, N-(2-hydroxyethyl)piperazine-N'-(2-hydroxypropanesulfonic acid), N-(2-hydroxyethyl)piperazine-N'-(3-propanesulfonic acid), 2-(N-cyclohexylamino)ethanesulfonic acid, and mixtures thereof. p-Toluene sulfonic acid is a preferred organic acid.

It is believed that the amount of the organic acid component in the composition will, for the most applications, comprise from about 0.01% to about 5% by weight of the composition, specifically, about 0.05% to about 5.0% by weight of the composition, or more specifically, about 0.1% to about 4.5% by weight of the composition. Alternatively the weight percent of the organic acid component (the total present in the solution and as part of the reaction product forming the surface modifier, that is the total amount added to the solution) in the composition may be in any range having endpoints selected from the following weight percents: 0.01, 0.05, 0.1, 0.15, 0.2, 0.25, 0.3, 0.35, 0.4, 0.45, 0.5, 0.7, 0.9, 1, 1.5, 2, 2.5, 3, 3.5, 4, 4.5 and 5. In some embodiments, the organic acid component comprises from about 0.1% to about 4.0% weight percent and, more specifically, from about 0.2 to about 3.5% or about from 0.3 to about 1.0% by weight of the composition.

In some embodiments, the organic acid and the alkylamine are added at a ratio of from 1:2 to 2:1 by weight to react and form the surface modifier. In other embodiments, the organic acid and the alkylamine are added at a ratio of about 1:1 by weight to form the surface modifier.

pH Adjusting Agent (Optional)

Preferably, the pH of the disclosed compositions in use is between about 1.0 and about 7.0. More preferably, the pH of the disclosed compositions in use is between about 1.0 and about 5.0. Most preferably, the pH of the disclosed compositions in use is between about 1.0 and about 3.0.

If necessary, an optional pH adjusting agent component can be any acid or base as required to adjust the pH of the composition to a value within the above-mentioned ranges. The pH-adjusting agent may be used to improve the stability of the compositions, to tune the ionic strength of the compositions, and to improve the safety in handling and use. Suitable pH-adjusting agents to lower the pH of the polishing composition include, but are not limited to, nitric acid, sulfuric acid, tartaric acid, succinic acid, citric acid, malic acid, malonic acid, various fatty acids, various polycarboxylic acids and mixtures thereof. Suitable pH-adjusting agents to raise the pH of the compositions include, but are not limited to, potassium hydroxide, sodium hydroxide, ammonia, tetraethylammonium hydroxide, ethylenediamine, piperazine, polyethyleneimine, modified polyethyleneimine, and mixtures thereof.

In some embodiments, extra organic acid employed as a component of the surface modifier may be added to lower the pH if needed and extra alkyl amine employed as the second component of the surface modifier may be added to raise the pH if needed.

The amount of pH-adjusting agent, if present in the composition, typically ranges from about 0.0001 wt % to about 5 wt % relative to the total weight of the compositions. The preferred range is about from 0.01 wt % to about 1 wt %.

Other Optional Ingredients

The composition of the present invention may also include one or more of the following additives: chelating agents, chemical modifiers, dyes, biocides, and other additives. The additive(s) may be added to the extent that they do not adversely affect the performance of the composition. The composition of the present may also be substantially free of or free of chelating agents, chemical modifiers, dyes, biocides, and other additives. The compositions of this invention may be substantially free or free of surfactants.

Method

In another aspect there is provided a method for treating a substrate including patterns having line-space dimensions of 50 nm or below, the method comprising rinsing the substrate with an aqueous composition comprising: a solvent system comprising water and a water-miscible organic solvent; a surface modifier that is a reaction product between an alkylamine and an organic acid; and a pH adjusting agent.

After the contacting step is an optional rinsing step. The rinsing step can be carried out by any suitable means such as, for example, immersion, spray, or via a single wafer process. The temperature of the composition during the contacting step is preferably from about 25 to 125° C. and more preferably from about 25 to 80° C.

After the contacting step is an optional rinsing step. The rinsing step may be carried out by any suitable means, for example, rinsing the substrate with de-ionized water by immersion or spray techniques. In preferred embodiments, the rinsing step may be carried out employing a mixture of de-ionized water and an organic solvent such as, for example, isopropyl alcohol.

After the contacting step and the optional rinsing step is an optional drying step that is carried out by any suitable means, for example, isopropyl alcohol (IPA) vapor drying, heat, or by centripetal force.

The surface treatment steps of this invention may be used after etching the substrate to form the patterns thereon, with or without one or more additional rinsing and/or drying steps preceding the surface treatment step. Additionally and alternatively, the surface treatment steps of this invention may be used after a photoresist cleaning step with or without one or more additional rinsing and/or drying steps preceding the surface treatment step. This method is particularly useful when the stack of materials for semiconductor devices comprise different materials such as silicon, silicon oxide, and silicon nitride in single or multiple layers in any order of those layers. The stack may be formed by a number of methods, including physical vapor deposition, chemical vapor deposition, electrochemical deposition and molecular beam epitaxy. The stack order may be silicon oxide layer on a silicon substrate to form a silicon oxide trench. As technical nodes shrink, more layers may be used in a stack, for example, a stack may include the middle silicon oxide layer on the bottom silicon layer and silicon nitride layer on the top. In order to prevent the pattern collapse of this and other new stack structures, the surface modification chemistry has to have an effect on the silicon oxide surface, as well as the other layers, such as, silicon nitride and silicon.

The features and advantages are more fully shown by the illustrative examples discussed below.

EXAMPLES

General Procedure for Preparing the Cleaning Compositions

All compositions which are the subject of the present Examples were prepared by mixing the components in a 250 mL beaker with a 1" Teflon-coated stir bar. Typically, the first material added to the beaker was deionized (DI) water followed by the other components in no particular order.

Compositions of the Substrate

The substrate evaluated were bare silicon wafers and silicon wafers with a layer of TEOS or SiN.

Processing Conditions

For contact angle tests, Si wafers were cleaved into 2 cm by 3 cm pieces. Both DHF pretreatment and surface modification processes were performed using 100 g of the compositions in a 150 ml beaker with a 1" long Teflon stir bar set at 500 rpm.

For DHF pretreatment, the test Si coupons were immersed in diluted hydrofluoric acid (DHF) (a mixture of 9.8 grams of 5% HF and 91.2 grams of DIW) at room temperature for 1 minute while stirring to remove native oxide. The segments were then rinsed for 3 minutes in a DI water bath and subsequently dried using filtered nitrogen.

The surface modification process followed the DHF pretreatment, the DHF treated Si coupons were dipped into the surface modifier composition at room temperature for 5 minutes while stirring and then dried using filtered nitrogen.

The water contact angle on surface modified Si coupon was measured by contact angle meter KRÜSS MSA after DHF pretreatment, rinsing, drying, contact with the surface treatment composition of this invention, and drying or just after DHF pretreatment and drying. In each case, the contact angle was measured after a droplet of DIW was contacted with the surface of the wafer piece.

Example 1: Evaluation of Surface Treatment Compositions Using Various Acids and Alkyl Chain Length on Alkylamine Table 1 lists five compositions comprising various acids and shows the effect on the contact angle.

Table 2 lists five compositions with varying alkyl chain lengths on the alkyl amine, where CTAB is cetyltrimethylammonium bromide. DPM is dipropylene glycol methyl ether.

Table 2 shows that the effect of the alkyl chain length on the contact angle on a silicon substrate. For the comparative example, the wafer pieces underwent the DHF pretreatment, but no surface treatment was contacted to the wafer pieces.

TABLE 1

| Example | D | R | S | F | V |
|---|---|---|---|---|---|
| 1-Dodecylamine | 0.25 | 0.25 | 0.25 | 0.25 | 0.25 |
| DIW | 70.00 | 70.00 | 70.00 | 70.00 | 70.00 |
| DPM | 30.00 | 30.00 | 30.00 | 30.00 | 30.00 |
| para Toluenesulfonic acid | 0.35 | | | | |
| Acetic acid | | 0.10 | | | |
| Propionic acid | | | 0.15 | | |
| Adipic acid | | | | 0.13 | |
| Benzoic acid | | | | | 0.20 |
| Total | 100.60 | 100.35 | 100.40 | 100.38 | 100.45 |
| pH | 2.53 | 6.09 | 5.59 | 5.87 | 5.48 |
| Surface Tension (dyne/cm) | 29.4 | — | 31.9 | 28.0 | 29.9 |
| C.A. surface treatment composition on bare Si (°) | 8.08 | 26.55 | 15.33 | 46.50 | 41.68 |
| Contact Angle measured (°) DIW on bare Si after surface treatment (°) | 74.80 | 38.87 | 37.25 | 50.63 | 50.34 |

TABLE 2

Surface Treatment Compositions Tested

| Raw Material (amounts in grams) | Comparative 1 | A | B | C | D |
|---|---|---|---|---|---|
| CTAB | 0.50 | 0.00 | 0.00 | 0.00 | 0.00 |
| 1-Hexylamine | 0.00 | 0.14 | 0.00 | 0.00 | 0.00 |
| 1-Octylamine | 0.00 | 0.00 | 0.18 | 0.00 | 0.00 |
| n-Decylamine | 0.00 | 0.00 | 0.00 | 0.22 | 0.00 |
| 1-Dodecylamine | 0.00 | 0.00 | 0.00 | 0.00 | 0.25 |
| DIW | 70.00 | 70.00 | 70.00 | 70.00 | 70.00 |
| DPM | 30.00 | 30.00 | 30.00 | 30.00 | 30.00 |
| Para Toluenesulfonic acid | 0.00 | 0.35 | 0.35 | 0.35 | 0.35 |
| Total | 100.50 | 100.49 | 100.53 | 100.57 | 100.60 |

TABLE 3

| Surface Treatment Compositions | Amine | Acid | pH | Surface tension (dyne/cm) | C.A. surface treatment composition on bare Si (°) | Contact Angle measured (°) DIW on bare Si after surface treatment (°) |
|---|---|---|---|---|---|---|
| Comparative Example 2 | None | None | — | — | — | 71.1 |
| Comparative Example 1 | See table above | See table above | 4.63 | 34.8 | 40.79 | 59.0 |
| Example A | See table above | See table above | 2.60 | 38.1 | 13.61 | 26.0 |
| Example B | See table above | See table above | 2.60 | 37.7 | 11.20 | 35.5 |
| Example C | See table above | See table above | 2.68 | 34.1 | 10.56 | 51.2 |
| Example D | See table above | See table above | 2.53 | 29.4 | 8.08 | 74.8 |

The Table 1 and Table 3 s provide results for the surface treatment compositions. "C.A." is contact angle. For the "C.A. surface treatment composition on bare Si", the contact angle for droplets of the surface treatment compositions on the Si wafers were measured after pretreatment with DHF, rinsing and drying as described above. For the "C.A. DIW on bare Si after surface treatment", the surfaces underwent DHF pretreatment, rinsing, drying, contact with the surface treatment composition of this invention, and drying prior to the C.A. test.

The same tests were repeated for composition D for wafers coated with TEOS and SiN respectively as reported in Table 4.

TABLE 4

| Surface modifier | Blank | D |
|---|---|---|
| System | — | Water-based |
| pH | — | 2.53 |
| Surface Tension γ (dyne/cm) | — | 29.4 |
| DIW Contact Angle θ (Bare Si with chemical treatment) | 71.06 | 65.17 |
| DIW Contact Angle θ (TEOS with chemical treatment) | 42.31 | 66.68 |
| DIW Contact Angle θ (SiN with chemical treatment) | 43.91 | 66.42 |

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

The invention claimed is:

1. An aqueous composition for treating a substrate including patterns having line-space dimensions of 50 nm or below to prevent collapse of the patterns, the composition comprising:
   a solvent system comprising water and a water-miscible organic solvent;
   a surface modifier that is a reaction product between an alkylamine and an organic acid;
   and optional pH adjusting agent;
   wherein said organic acid is selected from the group consisting of aliphatic carboxylic acids, aromatic carboxylic acids, amino carboxylic acids, sulfonic acids and aminosulfonic acids;
   the pH of the composition is from about 1 to about 5;
   wherein the alkylamine is selected from a primary amine or a secondary amine;
   and the composition is free of corrosion inhibitors.

2. The aqueous composition of claim 1 wherein the solvent system comprises water and dipropylene glycol methyl ether.

3. The aqueous composition of claim 2 wherein the water is present at 70 wt % based on the total weight of the solvent system and the dipropylene glycol methyl ether is present at 30 wt % based on the total weight of the solvent system.

4. The aqueous composition of claim 1 wherein the organic acid is p-toluenesulfonic acid.

5. The aqueous composition of claim 1 wherein the alkylamine is a primary amine.

6. The aqueous composition of claim 1 wherein the alkylamine is a secondary amine.

7. The aqueous composition of claim 1 wherein the organic acid is selected from the group consisting of sulfonic acids and aminosulfonic acids.

8. The aqueous composition of claim 5 wherein the alkylamine is dodecylamine.

9. The aqueous composition of claim 1 wherein the pH adjusting agent comprises excess organic acid.

10. The aqueous composition of claim 8, wherein said organic acid is selected from the group consisting of sulfonic acids and aminosulfonic acids.

11. A method for treating a substrate including patterns having line-space dimensions of 50 nm or below, the method comprising rinsing the substrate with an aqueous composition comprising:
    a solvent system comprising water and a water-miscible organic solvent;
    a surface modifier that is a reaction product between an alkylamine and an organic acid; and
    optional pH adjusting agent;
wherein said organic acid is selected from the group consisting of aliphatic carboxylic acids, aromatic carboxylic acids, amino carboxylic acids, sulfonic acids and aminosulfonic acids;
wherein the alkylamine is selected from a primary amine or a secondary amine;
the pH of the composition is from about 1 to about 5;
and the composition is free of corrosion inhibitors, and further
    wherein collapse of the patterns is substantially prevented.

12. The method of claim 11 wherein the contacting step occurs at a temperature of from about 25 to 125° C.

13. The method of claim 11 wherein the contacting step occurs at a temperature of from about 25 to 80° C.

14. The method of claim 11 wherein the solvent system comprises water and dipropylene glycol methyl ether.

15. The method of any of claim 11 wherein the water is present at 70 wt % based on the total weight of the solvent system and the dipropylene glycol methyl ether is present at 30 wt % based on the total weight of the solvent system.

16. The method of any of claim 11 wherein the organic acid is p-toluenesulfonic acid.

17. The method of claim 11 wherein the alkylamine is a primary amine.

18. The method of claim 11 wherein the alkylamine is a secondary amine.

19. The method of claim 11 wherein the organic acid is selected from the group consisting of sulfonic acids and aminosulfonic acids.

20. The method of claim 16 wherein the alkylamine is dodecylamine.

21. The method of claim 11 wherein the pH adjusting agent comprises excess organic acid.

22. The method of claim 20 wherein the organic acid is selected from the group consisting of sulfonic acids and aminosulfonic acids.

23. The aqueous composition of claim 1 wherein the alkylamine is selected from methylamine, ethylamine, n-propylamine, isopropylamine, n-butylamine, isobutylamine, s-butylamine, t-butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, nonadecylamine, icosylamine, eicosylamine, henicosylamine, heneicosylamine, docosylamine, tricosylamine, tetracosylamine, 1-methylbutylamine, 2-methylbutylamine, cyclopropylmethylamine, cyclohexylmethylamine, benzylamine, 2-methylbenzylamine, 4-methylbenzylamine, 1-phenylethylamine, 2-phenylethylamine, 3-aminomethylpyridine, 1-(4-chlorophenyl)ethylamine, 2-(2-chlorophenyl)ethylamine, 1-(3-methoxyphenyl)ethylamine, 1-(4-methoxyphenyl)ethylamine, 2-(2-methoxyphenyl)ethylamine, 2-(3-methoxyphenyl)ethylamine, 2-(4-methoxyphenyl)ethylamine, 1-[3-(trifluoromethyl)phenyl]ethylamine, 1-(1-naphthyl)ethylamine, 1-(2-naphthyl)ethylamine, 1-phenylpropylamine, and 3-phenylpropylamine, and mixtures thereof.

24. The method of claim 11 wherein the alkylamine is selected from methylamine, ethylamine, n-propylamine, isopropylamine, n-butylamine, isobutylamine, s-butylamine, t-butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, nonadecylamine, icosylamine, eicosylamine, henicosylamine, heneicosylamine, docosylamine, tricosylamine, tetracosylamine, 1-methylbutylamine, 2-methylbutylamine, cyclopropylmethylamine, cyclohexylmethylamine, benzylamine, 2-methylbenzylamine, 4-methylbenzylamine, 1-phenylethylamine, 2-phenylethylamine, 3-aminomethylpyridine, 1-(4-chlorophenyl)ethylamine, 2-(2-chlorophenyl)ethylamine, 1-(3-methoxyphenyl)ethylamine, 1-(4-methoxyphenyl)ethylamine, 2-(2-methoxyphenyl)ethylamine, 2-(3-methoxyphenyl)ethylamine, 2-(4-methoxyphenyl)ethylamine, 1-[3-(trifluoromethyl)phenyl]ethylamine, 1-(1-naphthyl)ethylamine, 1-(2-naphthyl)ethylamine, 1-phenylpropylamine, and 3-phenylpropylamine, and mixtures thereof.

* * * * *